(12) United States Patent
Wang et al.

(10) Patent No.: US 7,898,844 B2
(45) Date of Patent: Mar. 1, 2011

(54) MAGNETIC TUNNEL JUNCTION AND MEMRISTOR APPARATUS

(75) Inventors: Xiaobin Wang, Chanhassen, MN (US);
Yiran Chen, Eden Prairie, MN (US);
Alan Wang, Eden Prairie, MN (US);
Haiwen Xi, Prior Lake, MN (US);
Wenzhong Zhu, Apple Valley, MN (US);
Hai Li, Eden Prairie, MN (US);
Hongyue Liu, Maple Grove, MN (US)

(73) Assignee: Seagate Technology, LLC, Scotts Valley, CA (US)

( * ) Notice: Subject to any disclaimer, the term of this patent is extended or adjusted under 35 U.S.C. 154(b) by 144 days.

(21) Appl. No.: 12/367,966

(22) Filed: Feb. 9, 2009

(65) Prior Publication Data

US 2010/0109656 A1    May 6, 2010

Related U.S. Application Data

(60) Provisional application No. 61/109,970, filed on Oct. 31, 2008.

(51) Int. Cl.
*G11C 11/00* (2006.01)
(52) U.S. Cl. ................. 365/158; 365/171; 365/161
(58) Field of Classification Search .......... 365/158, 365/171, 161
See application file for complete search history.

(56) References Cited

U.S. PATENT DOCUMENTS

| | | | |
|---|---|---|---|
| 6,512,690 B1 * | 1/2003 | Qi et al. | 365/171 |
| 7,187,577 B1 | 3/2007 | Wang | |
| 7,224,601 B2 | 5/2007 | Panchula | |
| 7,272,034 B1 | 9/2007 | Chen | |
| 7,272,035 B1 | 9/2007 | Chen | |
| 7,289,356 B2 | 10/2007 | Diao | |
| 7,345,912 B2 | 3/2008 | Luo | |
| 7,359,235 B2 * | 4/2008 | Katti | 365/158 |
| 7,379,327 B2 | 5/2008 | Chen | |
| 7,443,711 B1 | 10/2008 | Stewart et al. | |
| 7,502,249 B1 | 3/2009 | Ding | |
| 7,515,457 B2 | 4/2009 | Chen | |
| 7,554,838 B2 * | 6/2009 | Chen | 365/171 |
| 2008/0079029 A1 | 4/2008 | Williams | |
| 2008/0237886 A1 | 10/2008 | Wu et al. | |
| 2008/0310213 A1 | 12/2008 | Chen | |
| 2008/0310219 A1 | 12/2008 | Chen | |
| 2009/0040855 A1 | 2/2009 | Luo | |
| 2009/0185410 A1 | 7/2009 | Huai | |

OTHER PUBLICATIONS

Strukov et al., The Missing Memristor Found; Nature, May 1, 2008, vol. 453, 80-83.

* cited by examiner

*Primary Examiner* — Connie C Yoha
(74) *Attorney, Agent, or Firm* — Campbell Nelson Whipps LLC (57) ABSTRACT

A magnetic memory device includes a magnetic tunnel junction having a free magnetic layer having a magnetization orientation that is switchable between a high resistance state magnetization orientation and a low resistance state magnetization orientation and a memristor solid state element electrically coupled to the magnetic tunnel junction. The memristor has a device response that is an integrated voltage versus an integrated current.

19 Claims, 6 Drawing Sheets

MAGNETIC TUNNEL JUNCTION AND MEMRISTOR APPARATUS

CROSS-REFERENCE TO RELATED APPLICATIONS

This application claims the benefit of U.S., Provisional Application No. 61/109,970 filed Oct. 31, 2008, the contents of which is hereby incorporated by reference in its entirety.

BACKGROUND

Fast growth of the pervasive computing and handheld/communication industry has generated exploding demand for electrical devices including high capacity nonvolatile solid-state data storage devices. Current devices using flash memory have several drawbacks such as slow access speed (~ms write and ~50-100 ns read), limited endurance (~$10^3$-$10^4$ programming cycles), and the integration difficulty in system-on-chip (SoC). Flash memory (NAND or NOR) also faces significant scaling problems at 32 nm node and beyond.

Magneto-resistive or magnetic random access memory (MRAM) is a promising candidate for future memory. One basic component of MRAM is a magnetic tunneling junction (MTJ). Data storage is realized by switching the resistance of MTJ between a high-resistance state and a low-resistance state. MRAM switches the MTJ resistance by using a current induced magnetic field or current induced spin torque transfer to switch the magnetization of the MTJ. In operation, the MRAM can be read by measuring the resistance and inferring the magnetization state of the MTJ. Electrical devices including those incorporating MRAM can be dependent on power utilization. The need exists for more efficient ways to monitor the power utilization of an electrical device.

As the MTJ size shrinks, magnetization fluctuation signature increases as the MTJ and MRAM devices scale down in size. Quantifying the magnetization fluctuation signature at nanometer length scale and monitoring power use is a challenge.

BRIEF SUMMARY

The present disclosure relates to magnetic tunnel junction and memristor apparatus. In particular, the present disclosure relates to a magnetic tunnel junction and memristor apparatus or device that quantifies magnetization fluctuation magnitude. The present disclosure also relates to a memristor and electrical device apparatus where the memristor measures the energy or power consumed by the electrical device.

In one particular embodiment, a magnetic memory device includes a magnetic tunnel junction having a free magnetic layer having a magnetization orientation that is switchable between a high resistance state magnetization orientation and a low resistance state magnetization orientation and a memristor solid state element electrically coupled to the magnetic tunnel junction. The memristor has a device response that is an integrated voltage versus an integrated current.

Another particular embodiment is a method of measuring magnetic fluctuations in a magnetic tunnel junction. The method includes passing a current through a magnetic tunnel junction and a memristor solid state element. The memristor solid state element measures a total memristor current value passing through the memristor solid state element. The method further includes determining a magnetic fluctuation value by subtracting a total baseline current value from the total memristor current value.

A further particular embodiment is a method of power consumed by an electrical device. The method includes passing current through a memristor solid state element and an electrical device. The memristor solid state element measures the current passing through the memristor solid state element and forms a memristance value. The memristor solid state element includes a varying resistance layer. The varying resistance layer includes a high resistance layer and a low resistance layer. The low resistance layer having oxygen vacancies. The varying resistance layer has a thickness of 10 nanometers or less. The method then includes reading the memristance value to determine the power consumed by the electrical device.

These and various other features and advantages will be apparent from a reading of the following detailed description.

BRIEF DESCRIPTION OF THE DRAWINGS

The disclosure may be more completely understood in consideration of the following detailed description of various embodiments of the disclosure in connection with the accompanying drawings, in which.

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

In the following description, reference is made to the accompanying set of drawings that form a part hereof and in which are shown by way of illustration several specific embodiments. It is to be understood that other embodiments are contemplated and may be made without departing from the scope or spirit of the present disclosure. The following detailed description, therefore, is not to be taken in a limiting sense. The definitions provided herein are to facilitate understanding of certain terms used frequently herein and are not meant to limit the scope of the present disclosure.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

The recitation of numerical ranges by endpoints includes all numbers subsumed within that range (e.g. 1 to 5 includes 1, 1.5, 2, 2.75, 3, 3.80, 4, and 5) and any range within that range.

As used in this specification and the appended claims, the singular forms "a", "an", and "the" encompass embodiments having plural referents, unless the content clearly dictates otherwise. As used in this specification and the appended claims, the term "or" is generally employed in its sense including "and/or" unless the content clearly dictates otherwise.

The present disclosure relates to magnetic tunnel junction and memristor apparatus. In particular, the present disclosure relates to a magnetic tunnel junction and memristor apparatus or device that quantifies magnetization fluctuation magnitude. The present disclosure also relates to a memristor and electrical device apparatus where the memristor measures the energy or power consumed by the electrical device. The memristor achieves a resistance dependent on the history of the current passing through it using a chemical mechanism. Quantifying magnetization fluctuation magnitude of a MTJ memory unit is a challenging task, especially when the magnetic fluctuations are at nano-lengths such as 1 to 50 nanometers, or from 1 to 25 nanometers or from 1 to 10 nanometers. For quantifying nano-length magnetization fluctuation magnitude of a MTJ memory unit, a memristor is combined in series with a magnetic tunneling junction. In addition, a memristor combined with an electrical device (including an electrical device using MTJ memory units in some embodiments) is able to operate as a nano-scale power monitor. While the present disclosure is not so limited, an appreciation of various aspects of the disclosure will be gained through a discussion of the examples provided below.

Figure 1:
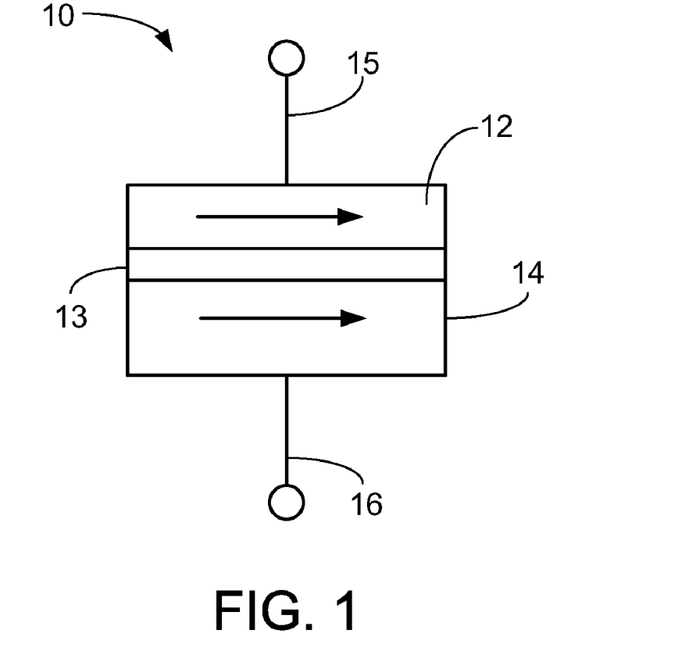
FIG. 1 is a cross-sectional schematic diagram of an illustrative MTJ memory unit in the low resistance state.
Figure 2:
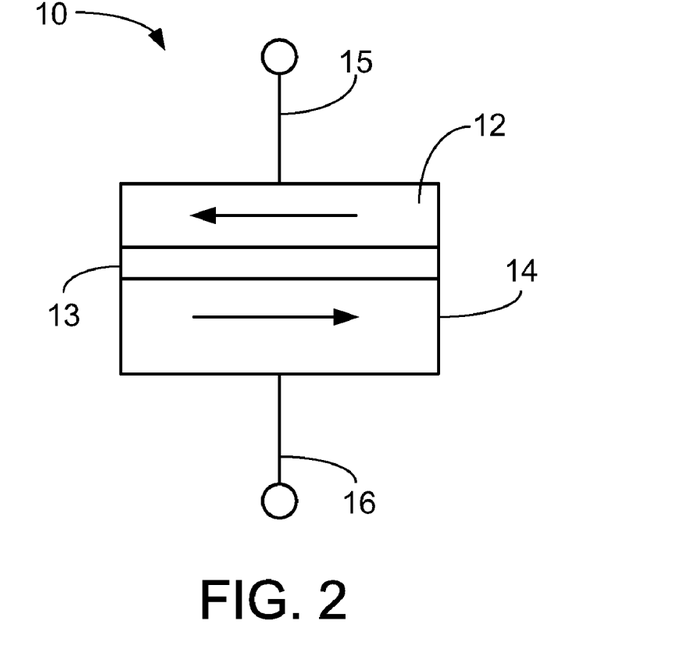
FIG. 2 is a cross-sectional schematic diagram of another MTJ memory unit in the high resistance state

FIG. 1 is a cross-sectional schematic diagram of an illustrative MTJ memory unit 10 in the low resistance state and FIG. 2 is a cross-sectional schematic diagram of another MTJ memory unit 10 in the high resistance state. A magnetic tunnel junction (MTJ) memory unit 10 includes a magnetic (e.g., ferromagnetic) free layer 12 and a magnetic (e.g., ferromagnetic) reference (i.e., pinned) layer 14.

In many embodiments, the MTJ memory unit 10 operates as a tunneling junction device where the magnetic free layer 12 and a magnetic reference layer 14 are separated by an oxide barrier layer 13. The insulating barrier layer 13 may be made of an electrically insulating material such as, for example an oxide material (e.g., $Al_2O_3$ or MgO). The insulating barrier layer 13 can be termed a tunnel barrier. Other suitable materials may also be used.

In other embodiments, the MTJ memory unit 10 operates as a spin valve where the magnetic free layer 12 and a magnetic reference layer 14 are separated by a non-magnetic conductive layer 13 spacer layer. The spacer layer 13 may be made of an electrically conducting non-magnetic material such as, for example Cu or Ru. The spacer layer 13 can be termed a tunnel barrier. Other suitable materials may also be used.

A first electrode 15 is in electrical contact with the magnetic free layer 12 and a second electrode 16 is in electrical contact with the magnetic reference layer 14. The magnetic layers 12, 14 may be made of any useful ferromagnetic (FM) alloys such as, for example, Fe, Co, Ni. Other suitable materials may also be used.

The electrodes 15, 16 electrically connect the magnetic layers 12, 14 to a control circuit providing read and write currents through the magnetic layers 12, 14. The resistance across the MTJ memory unit 10 is determined by the relative orientation of the magnetization vectors or magnetization orientations of the magnetic layers 12, 14. The magnetization direction of the magnetic reference layer 14 is pinned in a predetermined direction while the magnetization direction of the magnetic free layer 12 is free to rotate under the influence of a magnetic field or spin transfer torque. Pinning of the magnetic reference layer 14 may be achieved through, e.g., the use of exchange bias with an antiferromagnetically ordered material such as PtMn, IrMn and others.

FIG. 1 illustrates the MTJ memory unit 10 in the low resistance state where the magnetization orientation of the magnetic free layer 12 is parallel and in the same direction of the magnetization orientation of the magnetic reference layer 14. This is termed the low resistance state or "0" data state. FIG. 2 illustrates the MTJ memory unit 10 in the high resistance state where the magnetization orientation of the magnetic free layer 12 is anti-parallel and in the opposite direction of the magnetization orientation of the magnetic reference layer 14. This is termed the high resistance state or "1" data state.

In some embodiments, switching the resistance state and hence the data state of the MTJ memory unit 10 via magnetic field occurs when a current passing adjacent to the magnetic free layer 12 generates a magnetic field that rotates the magnetization orientation of the magnetic free layer 12 of the MTJ 10. When a sufficient magnetic field is applied to the free layer 12, the magnetization orientation of the free layer 12 can be switched between two opposite directions and accordingly the MTJ 10 can be switched between the parallel state (i.e., low resistance state or "0" data state) and anti-parallel state (i.e., high resistance state or "1" data state) depending on the direction of the magnetic field.

In some embodiments, switching the resistance state and hence the data state of the MTJ memory unit 10 via spin-transfer occurs when a current, passing through a magnetic layer of the MTJ memory unit 10, becomes spin polarized (i.e., polarized) and imparts a spin torque on the free layer 12 of the MTJ 10. When a sufficient spin torque is applied to the free layer 12, the magnetization orientation of the free layer 12 can be switched between two opposite directions and accordingly the MTJ 10 can be switched between the parallel state (i.e., low resistance state or "0" data state) and anti-parallel state (i.e., high resistance state or "1" data state) depending on the direction of the current.

The illustrative MTJ memory unit 10 may be used to construct a memory device that includes multiple MTJ memory units where a data bit is stored in MTJ memory unit by changing the relative magnetization state of the free magnetic layer 12 with respect to the reference magnetic layer 14. The stored data bit can be read out by measuring the resistance of the cell which changes with the magnetization direction of the free layer 12 relative to the reference magnetic layer 14.

Figure 3A:
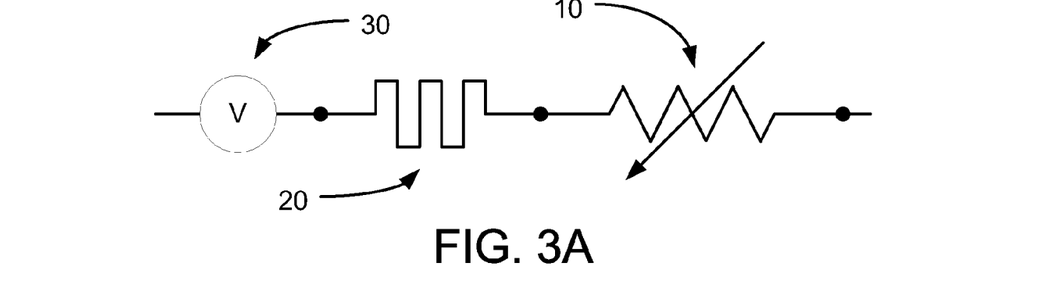
FIG. 3A is a schematic circuit diagram of an illustrative magnetic memory device.

FIG. 3A is a schematic circuit diagram of an illustrative magnetic memory device. The magnetic memory device includes a memory resistor (i.e., "memristor") 20 in serial electrical connection with a magnetic tunnel junction (MTJ) memory unit 10, described above, and a voltage source V. The memristor is a nanoscale (e.g., having dimensions in the nanometer range) solid state device that can be defined as having the following property:

$$d\phi = Mdq$$

where q is the electric charge φ is the magnetic flux and M is the memristance, since magnetic flux is the integration of voltage and charge is the integration of current. The memristor achieves a resistance dependent on the history of the current passing through it using a chemical mechanism.

Memristance can be defined as:

$$M(q) = \frac{d\varphi/dt}{dq/dt} = \frac{V}{I}$$

What makes memristance different from an ordinary constant resistance or even a current or voltage dependent non-linear resistance is that memristance is a function of charge, which depends upon the hysteretic behavior of the current (or voltage) profile.

Figure 4:
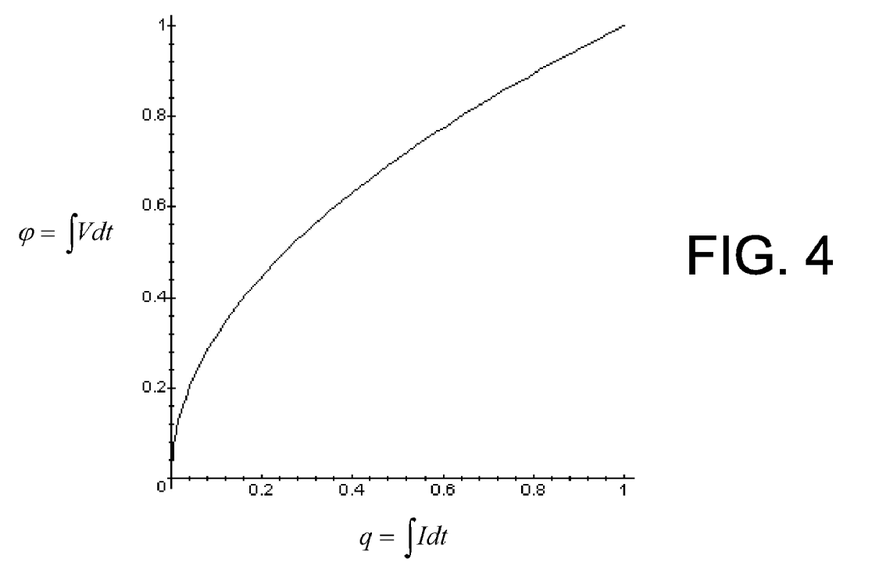
FIG. 4 is a graph of a memristor response of magnetic flux verses electric charge.

Memresistors have a special characteristic that the memristance M is unique for certain (φ, q) pair, as illustrated in FIG. 4. FIG. 4 is a graph of a memristor response of magnetic flux verses electric charge. The memristor device intrinsic relation is (φ, q) and one parameter out of (φ, q) can explicitly determine another. Because of this unique device characteristics, the integration of current or voltage signal can be stored as a state variable in memristor and driving can be achieved with constant voltage or current.

Figure 3B:
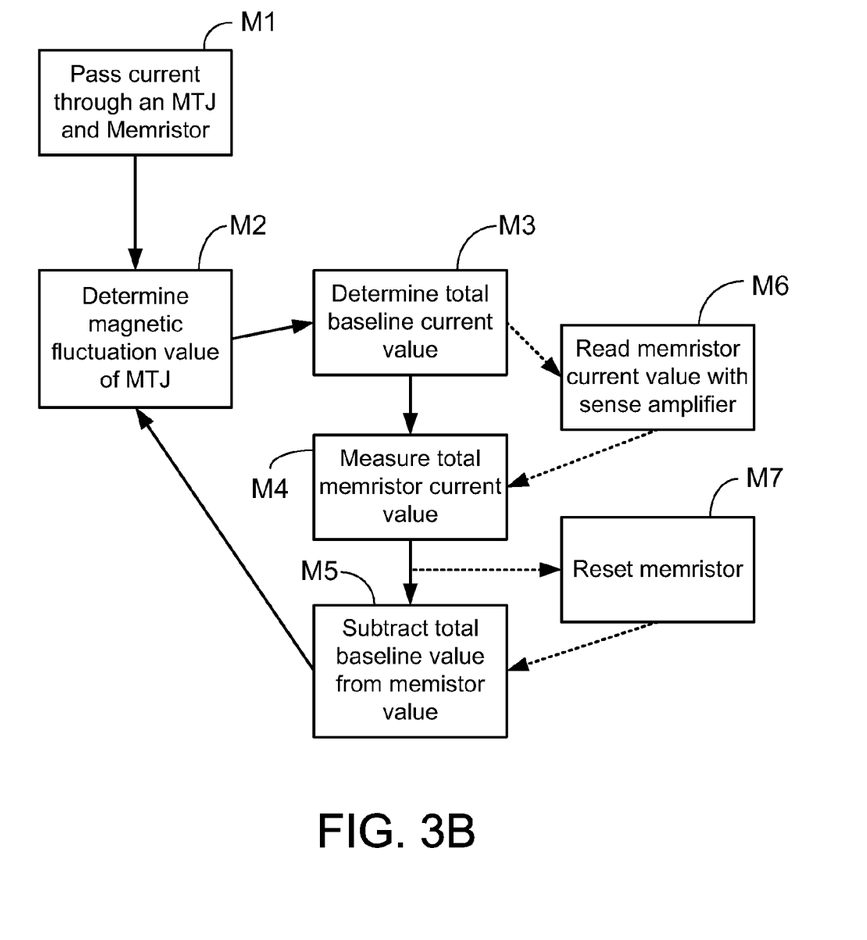
FIG. 3B is a flow diagram of an illustrative method of measuring magnetic fluctuations in a magnetic tunnel junction.

FIG. 3B is a flow diagram of an illustrative method of measuring magnetic fluctuations in a magnetic tunnel junction. The method includes passing a current through a magnetic tunnel junction and a memristor solid state element, at block M1. The memristor solid state element measures a total memristor current value passing through the memristor solid state element. Then the method includes determining a magnetic fluctuation value at block M2. A total baseline current value is determined by knowing the saturation value of the magnetic tunnel junction (see FIG. 6 and FIG. 7), at block M3, and measuring the total memristor current value at block M4, and then subtracting a total baseline current value from the total memristor current value, at block M5.

In many embodiments, the memristor current value can be read out using a sense amplifier, at block M6, as described below. The memristor can be reset, as described below, at block M7. The resetting operation can take place at any time following the read operation of block M6.

Figure 5:
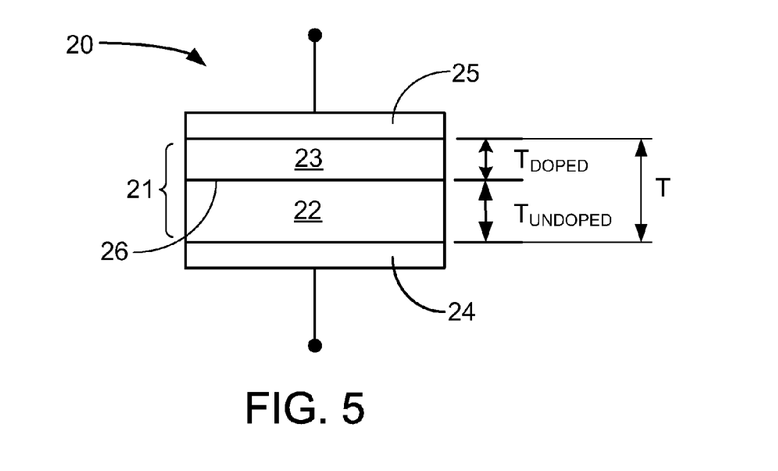
FIG. 5 is a schematic diagram of an illustrative memristor solid state device.

FIG. 5 is a schematic diagram of an illustrative memristor solid state device 20. The illustrated memristor solid state device 20 includes two electrodes 24, 25 separated by a varying resistance layer 21. The electrodes 24, 25 can be formed of any useful electrically conductive metallic material. The varying resistance layer 21 is formed of semiconductor material that has a region of high dopant concentration and a region of low dopant concentration. In some embodiments the varying resistance layer 21 is formed of a metal oxide such as titanium oxide, for example.

The varying resistance layer 21 has a thickness T in a range from 1 to 100 nanometers, or from 1 to 25 nanometers, or from 1 to 10 nanometers, or from 10 nanometers or less. In many embodiments the varying resistance layer 21 includes two layers. The first layer is a doped layer 23 having low resistance and the second layer is an undoped layer 22 having high resistance. Application of an external bias across the device 20 will move the boundary 26 between the two regions by causing the charged dopants in the doped layer 23 to drift into the undoped layer 22. Thus, the thickness $T_{UNDOPED}$ of the high resistance layer 22 and a thickness $T_{DOPED}$ of the low resistance layer 23 change as a function of an amount of charge passing thorough the memristor solid state element 20. Thus the resistance of the varying resistance layer 21 is dependent on how much charge has passed through the device 20 in a particular direction, which is reversible by changing the direction of the current.

In some embodiments the doped layer 23 has oxygen vacancies that act as charge carriers. When an electric field is applied across the device 20, the oxygen vacancies drift, changing the boundary 26 between the high-resistance layer 22 and low-resistance layer 23. Thus the resistance of the varying resistance layer 21 is dependent on how much charge has passed through the device 20 in a particular direction, which is reversible by changing the direction of the current. The solid state memristor device can be described as a nanoionic device.

Figure 6:
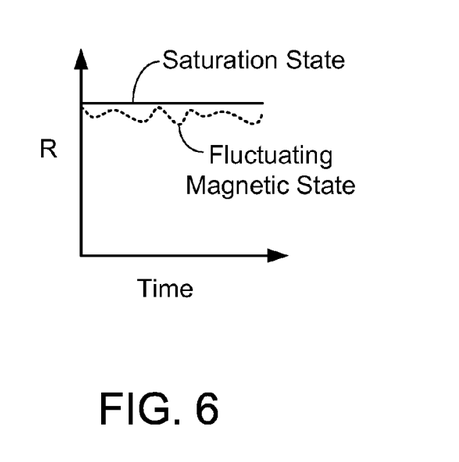
FIG. 6 is a graph of resistance verses time for a MTJ memory unit in the high resistance state.

Quantifying magnetization fluctuation magnitude of a MTJ memory unit is a challenging task, especially when the magnetic fluctuations are at nano-lengths such as 1 to 50 nanometers, or from 1 to 25 nanometers or from 1 to 10 nanometers. For quantifying nano-length magnetization fluctuation magnitude of a MTJ memory unit, a memristor is combined in series with a magnetic tunneling junction, as illustrated in FIG. 3A. The MTJ and memristor is driven at constant voltage. The magnetic tunneling junction has a property of modifying double sided fluctuations into one sided fluctuations as shown in FIG. 6 for the high resistance state and FIG. 7 for the low resistance state. The saturated free layer magnetization of the MTJ in the parallel (i.e., low resistance) state (FIG. 7) gives the lowest resistance and a constant low resistance denoted as Saturation State. Magnetization fluctuation (denoted as Fluctuating Magnetic State) away from the Saturation State results higher resistance. Similarly, the saturated free layer magnetization of the MTJ in the anti-parallel (i.e., high resistance) state (FIG. 6) gives highest resistance and a constant high resistance denoted as Saturation State. Magnetization fluctuation (denoted as Fluctuating Magnetic State) from the saturation state results in lower resistance.

The current of the circuit shown in FIG. 3 is:

$$I = \frac{V}{R} = \frac{V}{R_0 + \delta R} = I_0 - \delta I$$

where $I_0$ is the is the current without magnetization fluctuation and $\delta I$ is the current due to magnetization fluctuation. The memristor stores the integrated current information:

$$\int_0^T (I_0 - \delta I) dt$$

that can be described as total memristor current value passing through the memristor solid state element. After subtracting a baseline current value $$\int_0^T I_0 \, dt$$

from the total memristor current value, the memristor state can give the integrated magnetization fluctuation magnitude for a given period of time.

When the MTJ memory unit is in the high resistance state, the total memristor current value is less than the total baseline current value for a given time period as illustrated in FIG. 6. This results from the memristor integrating the Fluctuating Magnetic State curve and subtracting that area value from the total baseline current value or Saturation State to quantify the magnetization fluctuation magnitude of a MTJ memory unit for a given time period.

Figure 7:
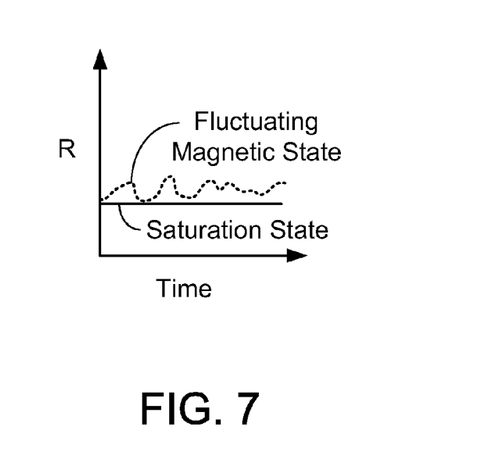
FIG. 7 is a graph of resistance verses time for a MTJ memory unit in the low resistance state.

When the MTJ memory unit is in the low resistance state, the total memristor current value is greater than the total baseline current value for a given time period as illustrated in FIG. 7. This results from the memristor integrating the Fluctuating Magnetic State curve and subtracting that area value from the total baseline current value or Saturation State to quantify the magnetization fluctuation magnitude of a MTJ memory unit for a given time period.

Figure 8:
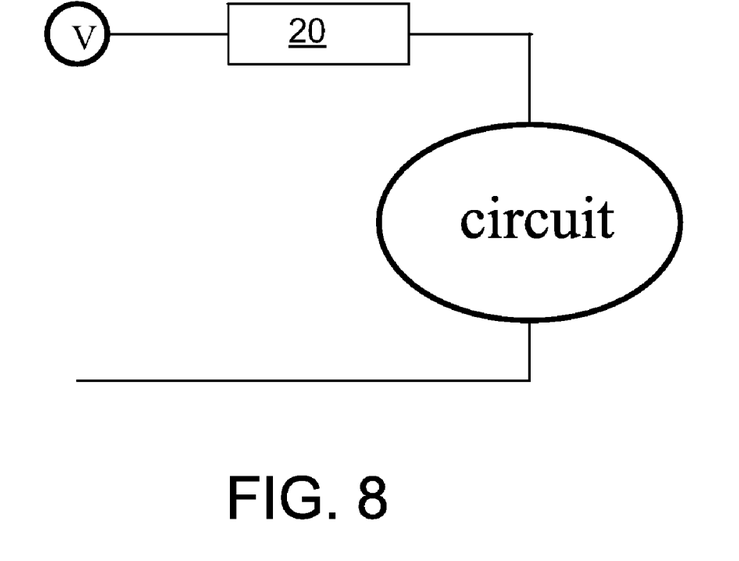
FIG. 8 is a schematic circuit diagram of a memristor-based power monitor system where the memristor is electrically connected to the circuit in series.
Figure 9:
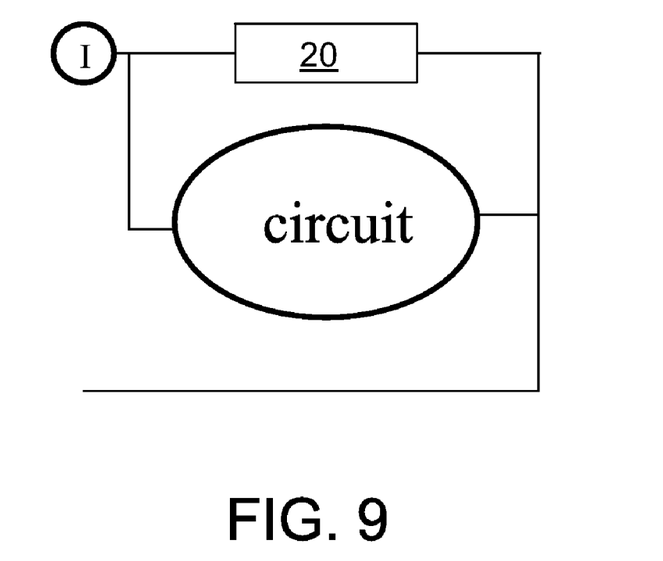
FIG. 9 is a schematic circuit diagram of a memristor-based power monitor system where the memristor is electrically connected to the circuit in parallel.

FIG. 8 is a schematic circuit diagram of a memristor-based power monitor system where the memristor 20 is electrically connected to the circuit in series. FIG. 9 is a schematic circuit diagram of a memristor-based power monitor system where the memristor 20 is electrically connected to the circuit in parallel.

The memristor-based power monitor system illustrated in FIG. 8 is powered by a constant voltage V, which is provided by a voltage source. The energy consumed by the whole system, including both memristor and circuit, is calculated as:

$$E = \int VIdt = V \int Idt$$

$\int Idt$ can be read out by the memristance of the memristor. Since V is known, the energy consumed by the whole system can be read out. To minimize the impact of the memristor, the memristance of the memristor is assumed to be much smaller than the resistance of the circuit.

The memristor-based power monitor system illustrated in FIG. 9 is powered by a constant current I, which is provided by a current source. The energy consumed by the whole system, including both memristor and circuit, is calculated as:

$$E = \int VIdt = I \int Vdt$$

$\int Vdt$ can be read out by the memristance of the memristor. Since I is known, the energy consumed by the whole system can be read out. To minimize the impact of the memristor, the memristance of memristor is assumed to be much bigger than the resistance of the circuit.

Figure 10:
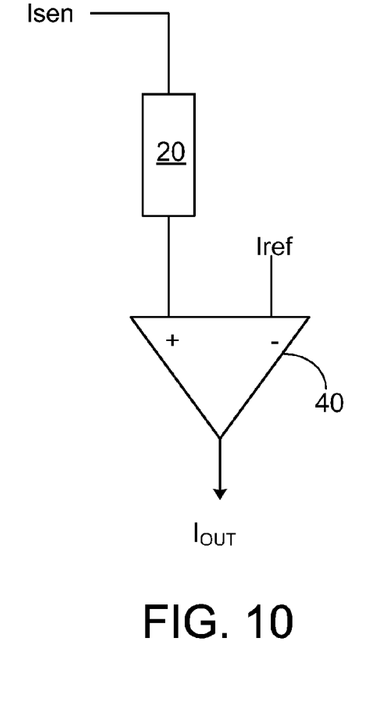
FIG. 10 is a schematic circuit diagram of a memristor resistance value detection system utilizing a sensing and reference voltage.
Figure 11:
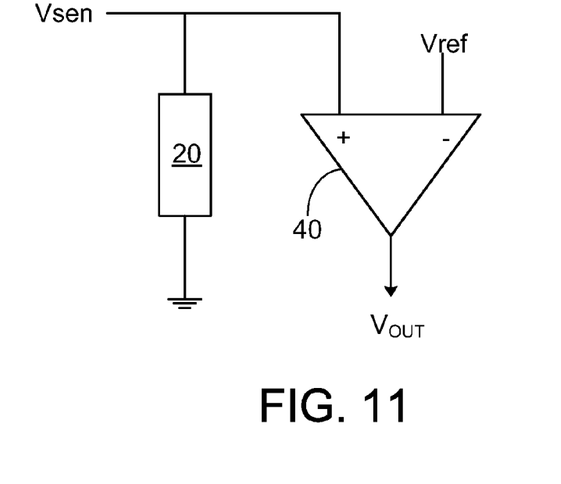
FIG. 11 is a schematic circuit diagram of a memristor resistance value detection system utilizing a sensing and reference current.

Reading out the value of memristance is the same as other resistance read methods, like a magnetic tunnel junction read, a current or voltage can be applied to memristor. The generated corresponding current or voltage is compared to a reference for resistance value detection, as shown in FIG. 10 and FIG. 11. FIG. 10 is a schematic circuit diagram of a memristor resistance value detection system utilizing a sensing and reference voltage. FIG. 11 is a schematic circuit diagram of a memristor resistance value detection system utilizing a sensing and reference current. The memristor 20 is electrically connected to a sense amplifier 40. FIG. 10 illustrates the memristor 20 in serial electrical connection and FIG. 11 illustrated the memristor 20 in parallel electrical connection. The sense amplifier 40 of FIG. 10 utilizes a reference current Iref and compares that to a sense current Isense to generate an output current Iout for readout. The sense amplifier 40 of FIG. 11 utilizes a reference voltage Vref and compares that to a sense voltage Vsense to generate an output voltage Vout for readout. Such a read operation may disturb the state of memristor. To recover the state, an opposite current or voltage with same time duration can be applied.

Thus, embodiments of the MAGNETIC TUNNEL JUNCTION AND MEMRISTOR APPARATUS are disclosed. The implementations described above and other implementations are within the scope of the following claims. One skilled in the art will appreciate that the present disclosure can be practiced with embodiments other than those disclosed. The disclosed embodiments are presented for purposes of illustration and not limitation, and the present invention is limited only by the claims that follow.

What is claimed is:

1. A magnetic memory device comprising:
   a magnetic tunnel junction comprising a free magnetic layer having a magnetization orientation that is switchable between a high resistance state magnetization orientation and a low resistance state magnetization orientation; and
   a memristor solid state element electrically coupled to the magnetic tunnel junction, the memristor having a device response that is an integrated voltage versus an integrated current, the memristor solid state element comprises a varying resistance layer, the varying resistance layer comprising a high resistance layer and a low resistance layer comprising oxygen vacancies, the varying resistance layer having a thickness of 10 nanometers or less.

2. A magnetic memory device according to claim 1, wherein the memristor solid state element is in serial electrical connection with the magnetic tunnel junction.

3. A magnetic memory device according to claim 1, wherein a thickness of the high resistance layer and a thickness of the low resistance layer change as a function of an amount of charge passing thorough the memristor solid state element.

4. A magnetic memory device according to claim 1, wherein the memristor solid state element measures total current passing through the magnetic tunnel junction.

5. A method of measuring magnetic fluctuations in a magnetic tunnel junction comprising:
   passing a current through a magnetic tunnel junction and a memristor solid state element, the memristor solid state element measures a total memristor current value passing through the memristor solid state element, the memristor solid state element comprises a varying resistance layer, the varying resistance layer comprising a high resistance layer and a low resistance layer comprising oxygen vacancies; and
   determining a magnetic fluctuation value by subtracting a total baseline current value from the total memristor current value.

6. A method according to claim 5, wherein the total baseline current value is determined when the magnetic tunnel junction possesses a constant high resistance saturation state.

7. A method according to claim 5, wherein the total baseline current value is determined when the magnetic tunnel junction possesses a constant low resistance saturation state.

8. A method according to claim 6, wherein the total memristor current value is less than the total baseline current value.

9. A method according to claim 7, wherein the total memristor current value is greater than the total baseline current value.

10. A method according to claim 5, further comprising reading the total memristor current value with a sense amplifier in electrical connection with the memristor solid state device.

11. A method according to claim 10, wherein the sense amplifier is in parallel electrical connection with the memristor solid state device.

12. A method according to claim 10, wherein the sense amplifier is in serial electrical connection with the memristor solid state device.

13. A method according to claim 10, further comprising resetting the memristor solid state device by passing a current through the memristor solid state device in a direction opposing the passing step current direction.

14. A method according to claim 10, wherein the varying resistance layer has a thickness of 10 nanometers or less.

15. A method according to claim 14, wherein a thickness of the high resistance layer and a thickness of the low resistance layer change as a function of an amount of charge passing thorough the memristor solid state element.

16. A method according to claim 10, wherein the memristor solid state element measures total current passing through the magnetic tunnel junction.

17. A method of monitoring power consumed by an electrical device comprising:

passing current through a memristor solid state element and an electrical device, the memristor solid state element measuring the current passing through the memristor solid state element and forming a memristance value, the memristor solid state element comprises a varying resistance layer, the varying resistance layer comprising a high resistance layer and a low resistance layer comprising oxygen vacancies, the varying resistance layer having a thickness of 10 nanometers or less; and reading the memristance value to determine the power consumed by the electrical device.

18. The method according to claim 17, wherein the memristor solid state element and an electrical device are in serial electrical connection and the current is provided with a constant voltage source.

19. The method according to claim 17, wherein the memristor solid state element and an electrical device are in parallel electrical connection and the current is provided with a constant current source.

* * * * *